United States Patent [19]

Hatsuda et al.

[11] Patent Number: 5,252,863
[45] Date of Patent: Oct. 12, 1993

[54] DRIVE CIRCUIT FOR USE IN A SEMICONDUCTOR INTEGRATED CIRCUIT

[75] Inventors: Tsuguyasu Hatsuda, Neyagawa; Seiji Yamaguchi, Hirakata, both of Japan

[73] Assignee: Matsushita Electric Industrial Co., Ltd., Osaka, Japan

[21] Appl. No.: 848,372

[22] Filed: Mar. 9, 1992

[30] Foreign Application Priority Data

Mar. 11, 1991 [JP] Japan .................... 3-44786

[51] Int. Cl.[5] .......................... H03K 19/20
[52] U.S. Cl. ..................... 307/452; 307/481; 365/230.06
[58] Field of Search ............. 307/452-453, 307/480-481; 365/230.06

[56] References Cited

U.S. PATENT DOCUMENTS

| | | | |
|---|---|---|---|
| 4,514,829 | 4/1985 | Chao | 365/230.06 |
| 4,521,695 | 6/1985 | Mazin et al. | 307/452 |
| 4,720,816 | 1/1988 | Matsuoka et al. | 365/230.06 |
| 5,073,726 | 12/1991 | Kato et al. | 307/451 |

FOREIGN PATENT DOCUMENTS 1-175414  7/1989  Japan .

OTHER PUBLICATIONS

S. Aizaki et al., "A 15ns 4nb CMOS SRAM"; ISSCC Digest of Technical Papers, pp. 126-127; Feb,. 1990.

*Primary Examiner*—Edward P. Westin
*Assistant Examiner*—Andrew Sanders
*Attorney, Agent, or Firm*—Ratner & Prestia

[57] ABSTRACT

A drive circuit provided in a semiconductor integrated circuit can perform a high-speed switching in compliance with a synchronizing signal and has a number of drive circuit elements. Each of the drive circuit elements is provided with a P-channel MOSFET, an N-channel MOSFET, and an inverter circuit to generate an output signal. The P-channel MOSFET has a gate connected to an input line of a first input signal and a source connected to a source line whereas the N-channel MOSFET has a gate connected to the input line of the first input signal, a source connected to an input line of an inverted logic signal of a second input signal, and a drain connected to a drain of the P-channel MOSFET. The inverter circuit has a gate connected to the drain of the P-channel MOSFET to generate the output signal in synchronization with the second input signal.

4 Claims, 8 Drawing Sheets

DRIVE CIRCUIT FOR USE IN A SEMICONDUCTOR INTEGRATED CIRCUIT

BACKGROUND OF THE INVENTION

1. Field of the Invention

The present invention relates generally to a drive circuit suited for use in a large-scale semiconductor integrated circuit, and more particularly to a drive circuit capable of performing a high-speed switching in compliance with a synchronizing signal.

2. Description of the Prior Art

A drive circuit for performing a switching operation in synchronization with a clock signal generally comprises a number of drive circuit elements and is used, for example, on word lines of RAMs, ROMs, and register files or on output lines for AND signals of PLAs.

Figure 1:
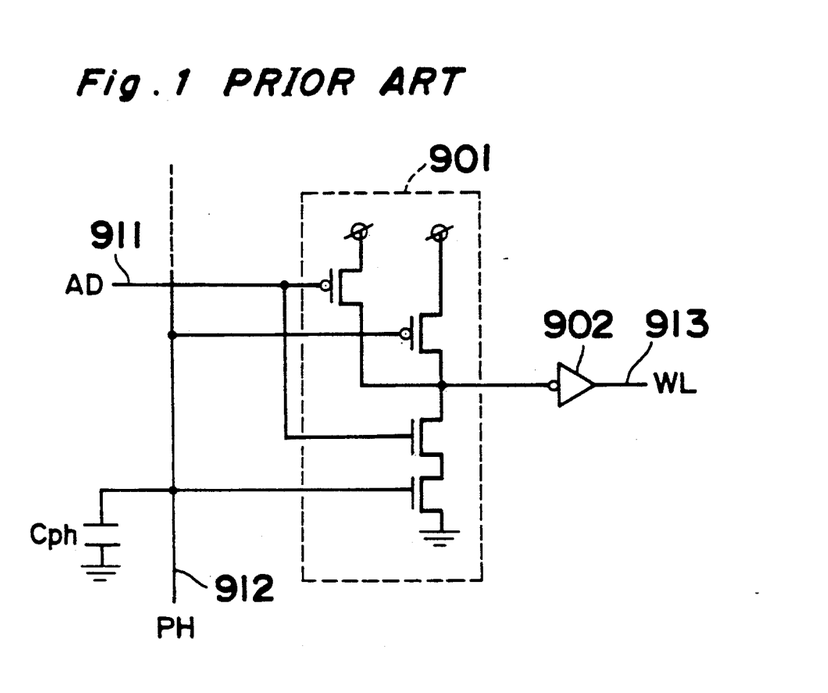
FIG. 1 is a circuit diagram of a conventional drive circuit element.

FIG. 1 depicts a conventional drive circuit element comprising a NAND circuit 901, an inverter 902, an input line 911 of an input signal AD, an input line 912 of a clock signal PH, and an output line 913 of an output WL from the drive circuit element. A CMOS circuit, a BiCMOS circuit, a BiNMOS circuit, or the like is preferably employed as the inverter 902.

Figure 2:
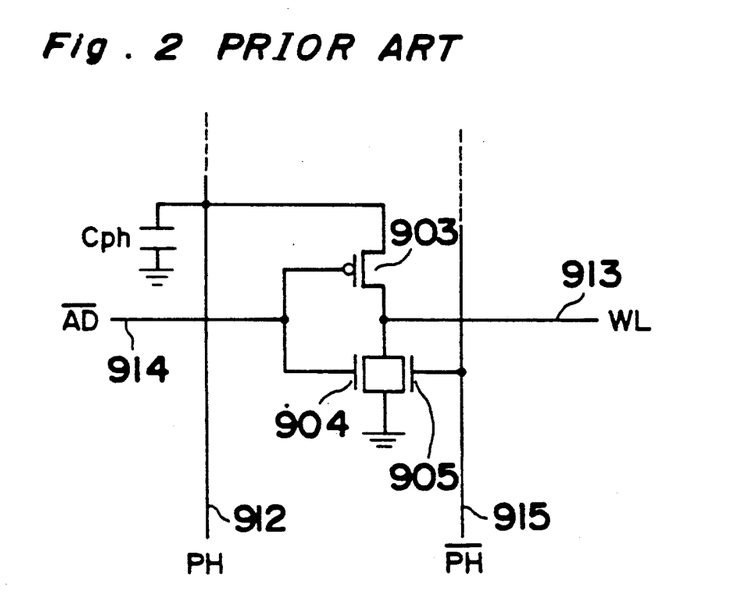
FIG. 2 is a circuit diagram of another conventional drive circuit element.

FIG. 2 depicts another conventional drive circuit element employing a P-channel MOSFET 903 and two N-channel MOSFETs 904 and 905. An input line 914 of an inverted ADDRESS signal $\overline{AD}$ is connected to a gate of the P-channel MOSFET 903 and to that of the N-channel MOSFET 904. When a clock signal PH is at a high level, the P-channel MOSFET 903 raises the voltage of an output line 913. When an ADDRESS signal AD is at a low level, i.e, an inverted ADDRESS signal $\overline{AD}$ is at a high level, the N-channel MOSFET 904 lowers the voltage of the output line 913. When the clock signal PH is at a low level, i.e., an inverted clock signal $\overline{PH}$ is at a high level, the N-channel MOSFET 905 lowers the voltage of the output line 913.

When these conventional drive circuit elements are employed to drive word lines of a large-scale RAM, the problem of lowering the switching speed occurs.

In the drive circuit element shown in FIG. 1, for example, let the case be considered in which the input signal AD is a decoded output of a line address and the clock signal PH is a synchronizing signal. The clock signal PH is required to drive both the gate of the N-channel MOSFET and that of the P-channel MOSFET of the NAND circuit 901. In a RAM having a large line size, because a number of drive circuit elements are connected to a clock signal line, a load capacitance Cph of the input signal line becomes large, thereby lowering the switching speed.

On the other hand, in the drive circuit element shown in FIG. 2, the input line of the clock signal PH is connected to a source of the P-channel MOSFET. As viewed from a clock output circuit, a load connected to the output line is driven via a internal resistance of the P-channel MOSFET during the ON-state thereof. Because the word lines of a RAM have respective relatively large loads on output lines thereof, the presence of this resistance lowers the switching speed.

Due to the high speed of N-channel MOSFETs, the retardation of the short channel effect of P-channel MOSFETs, the matching with the NMOS process, and the like, the so-called N-well method, in which a P-channel MOSFET is formed in a N-type impurity range formed on a P-type substrate, is generally employed as a device formation method. Because the N-well is higher in impurity concentration than the P-type substrate, the junction capacitance of the P-channel MOSFET between the N-well and the source or between the N-well and the drain is greater than that of the N-channel MOSFET. When a number of drive circuit elements are connected to the clock signal line, the load capacitance Cph becomes large, and therefore, the switching speed is lowered. Furthermore, because the drain saturation current of the P-channel MOSFET is less than that of the N-channel MOSFET, the gate size of the P-channel MOSFET must be enlarged for the high-speed switching operation. This conversely further increases the junction capacitance.

SUMMARY OF THE INVENTION

The present invention has been developed to overcome the above-described disadvantages.

It is accordingly an object of the present invention to provide a drive circuit capable of performing a high-speed switching operation.

In accomplishing this and other objects, a drive circuit element according to the present invention comprises a first P-channel MOSFET, an N-channel MOSFET, and an inverter circuit. The first P-channel MOSFET has a gate connected to an input line of a first input signal and a source connected to a power supply line whereas the N-channel MOSFET has a gate connected to the input line of the first input signal, a source connected to an input line of an inverted logic signal of a second input signal, and a drain connected to a drain of the first P-channel MOSFET. The inverter circuit has a gate connected to the drain of the first P-channel MOSFET to generate an output signal in synchronization with the second input signal.

When the first and second input signals are both at respective high-level states, the N-channel MOSFET turns on. At this moment, because the input line of the inverted logic signal of the second input signal connected to the drain of the N-channel MOSFET is at a low-level state, the voltage of the gate input line of the inverter circuit turns low and that of the output line turns high.

On the other hand, when the first input signal is at a high-level state and the second input signal is at a low-level state, the N-channel MOSFET turns on. At this moment, because the input line of the inverted logic signal of the second input signal is at a high-level state, the voltage of the gate input line of the inverter circuit turns high and that of the output line turns low. Due to the pull-up by the N-channel MOSFET, however, the voltage of the gate input line of the inverter circuit is lower than a power supply voltage by a threshold voltage of the N-channel MOSFET.

When the first input signal is at a low-level state, the first P-channel MOSFET turns on irrespective of the voltage of the second input signal line. As a result, the voltage of the gate input line of the inverter circuit and that of the output line turns high and low, respectively.

As described above, the drive circuit element according to the present invention can perform an AND operation with respect to two signals. Furthermore, because the junction capacitance of an N-channel MOSFET, which is discussed later in detail, is considerably smaller than the gate capacitance, the load capacitance of the signal line can be reduced, thereby enabling a high-speed switching operation.

A second P-channel MOSFET may be incorporated in the drive circuit element. Preferably, the second P-channel MOSFET has a gate connected to an input line of the second input signal, a source connected to the power supply line, and a drain connected to the drain of the first P-channel MOSFET. When the second input signal is at a low-level state, the second P-channel MOSFET turns on, thereby raising the pull-up voltage of the gate input line of the inverter circuit to the power supply voltage.

The second P-channel MOSFET may have a gate connected to an input line of an inverted logic signal of the first input signal, a source connected to the input line of the inverted logic signal of the second input signal, and a drain connected to the drain of the first P-channel MOSFET. In this case, when the first and second input signals are at a high-level state and at a low-level state, respectively, the second P-channel MOSFET turns on, thereby raising the voltage of the gate input line of the inverter circuit to the power supply voltage.

Furthermore, the second P-channel MOSFET may have a source connected to the input line of the inverted logic signal of the second input signal and a drain connected to the drain of the first P-channel MOSFET. Alternatively, the second P-channel MOSFET may have a gate and a source both connected to the input line of the inverted logic signal of the second input signal and a drain connected to the drain of the first P-channel MOSFET. The use of the N-channel MOSFET and the second P-channel MOSFET can drive the gate input line at a high speed.

BRIEF DESCRIPTION OF THE DRAWINGS

This and other objects and features of the present invention will become more apparent from the following description of a preferred embodiment thereof with reference to the accompanying drawings, throughout which like parts are designated by like reference numerals, and wherein:

FIGS. 5b and 5c are diagrams showing modifications of the diagram of FIG. 5a;

FIG. 6b is a diagram showing a modification of the diagram of FIG. 6a;

DETAILED DESCRIPTION OF THE PREFERRED EMBODIMENTS

Figure 3:
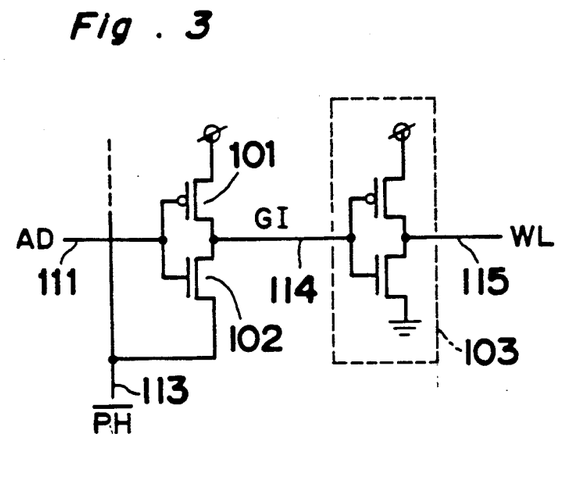
FIG. 3 is a circuit diagram of a drive circuit element according to a first embodiment of the present invention.

Referring now to the drawings, there is shown in FIG. 3 a drive circuit element according to a first embodiment of the present invention, which is intended to drive one of word lines of a RAM. This drive circuit element comprises a P-channel MOSFET 101 having a gate connected to an output line 111 of a decoded output AD of an address, an N-channel MOSFET 102 having a gate connected to the output line 111 of the decoded output AD and a source connected to an input line 113 of an inverted clock signal $\overline{PH}$, and a CMOS inverter circuit 103 having a gate input line (GI) 114 connected to an output line of the P-channel MOSFET. An output WL from the drive circuit element is sent via an output line 115.

The voltage of several signals running in the circuit element of FIG. 3 is shown in Table 1 below.

TABLE 1

| AD | PH | GI | WL |
|----|----|----|-----|
| L  | L  | H  | L  |
| L  | H  | H  | L  |
| H  | L  | H  | L  |
| H  | H  | L  | H  |

Figure 4:
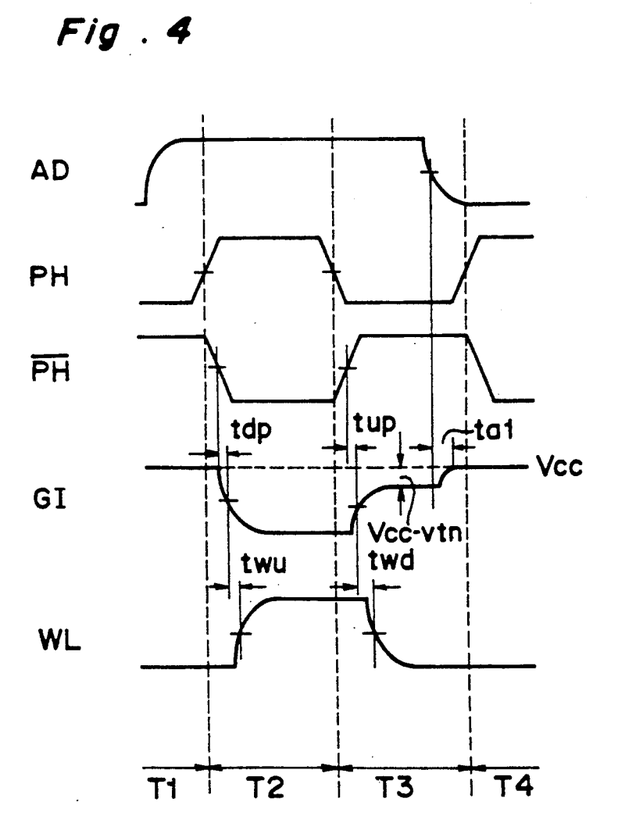
FIG. 4 is a timing chart in the diagram of FIG. 3.

The operation of the AND circuit according to this embodiment is discussed hereinafter with reference to a timing chart shown in FIG. 4.

Time Interval T1

When the address decoding causes the decoded signal AD to change from "L" (low level) to "H" (high level), the P-channel MOSFET 101 turns off whereas the N-channel MOSFET 102 turns on. Because an input line of the clock signal PH is "L", i.e., an input line 113 of the inverted clock signal $\overline{PH}$ is "H", the N-channel MOSFET 102 makes the gate input line 114 of the inverter circuit 103 be "H" and the output line WL 115 is maintained at the state of "L".

Time Interval T2

When the clock signal PH turns "H", i.e., the inverted clock signal $\overline{PH}$ turns "L" with the decoded signal AD being at the state of "H", the N-channel MOSFET 102 makes the gate input line 114 be "L" after the lapse of a time $t_{dp}$. After the further lapse of a time $t_{wu}$, the output line WL 115 turns "H".

Time Interval T3

When the clock signal PH turns "L", i.e., the inverted clock signal $\overline{PH}$ turns "H" with the decoded signal AD being at the state of "H", the N-channel MOSFET 102 makes the gate input line 114 be "H" after the lapse of a time $t_{up}$. After the further lapse of a time $t_{wd}$, the voltage of the output line WL 115 turns "L". The pull-up by the N-channel MOSFET 102 causes the voltage of the gate input line 114 to be (Vcc-Vtn), which is lower than a power supply voltage Vcc by a threshold voltage Vtn of the N-channel MOSFET 102.

Time Interval T4

When the decoded signal AD turns "L", the P-channel MOSFET 101 turns on, and after the lapse of a time $t_{ab}$, the voltage of the gate input line 114 is raised to the power supply voltage Vcc. The output line WL 115 is maintained at the state of "L".

As described above, the drive circuit element of FIG. 3 can perform an AND operation with respect to two signals. In other words, this circuit element enables a synchronous drive output of the two signals.

Even when a heavy load capacitance is connected to the output line, because the inverter circuit 103 drives the load, any reduction in driving performance is not caused by the internal resistance during the ON-state and the delay time is not increased, unlike the case shown in FIG. 2. Because the N-channel MOSFET 102 directly drives no large load, it is sufficient if the N-channel MOSFET 102 can charge or discharge the gate capacitance of the inverter circuit 103. Accordingly, the junction capacitance can be reduced.

Furthermore, the junction capacitance of an N-channel MOSFET is small and is about one-fifth of the gate capacitance. When a MOSFET is formed in an N-well of a P-type substrate, the junction capacitance of an N-channel MOSFET is about one-third of that of a P-channel MOSFET. Accordingly, even when a number of drive circuit elements are connected to an input line of the inverted clock signal $\overline{PH}$, the load capacitance of a signal line can be reduced, thereby realizing a high-speed switching operation. In addition, because a combination of two MOSFETs and an output inverter can perform an AND operation with respect to two signals, the number of constituent elements and the area required for layout thereof can be reduced, as compared with the conventional circuit element employing a CMOS-type NAND circuit.

The use of a BiCMOS or BiNMOS inverter circuit at an output stage can further increase the speed of the switching operation. As is known on pages 75 to 79 in "BiCMOS Technology and Applications (1989)" written by Antonio R. Alvarez and published by Kluer Academic Publishers, the junction capacitance of a MOS transistor made through the BiCMOS process can be made smaller than that of a MOS transistor made through the CMOS process. Accordingly, a high-speed switching can be achieved by reducing the load capacitance of an input line. Furthermore, the formation of a transistor by the use of silicide can reduce the area of the drain, and therefore, can reduce the parasitic capacitance thereof, thus resulting in the further reduction in load capacitance of the input line.

Figure 5A:
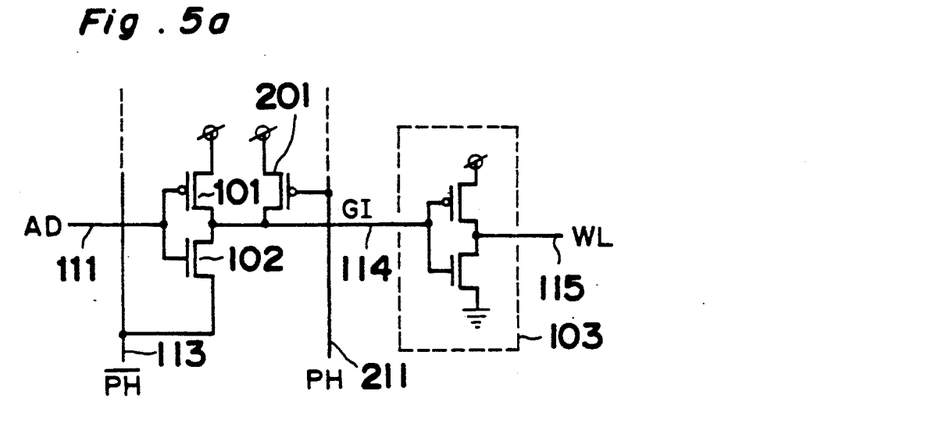
FIG. 5a is a diagram similar to FIG. 3, according to a second embodiment of the present invention.

FIG. 5a depicts a drive circuit element according to a second embodiment of the present invention, in which are provided an N-channel MOSFET 102 having a gate connected to an output line 111 of an ADDRESS signal AD and a P-channel MOSFET 201 having a gate connected to an input line 211 of a clock signal PH in order to pull-up an input line 114 of an inverter circuit 103 during the OFF-state of the drive circuit element.

When the clock signal PH turns "L" during the OFF-state of the circuit element, the P-channel MOSFET 201 turns on. Unlike the first embodiment, the voltage required to pull-up the gate input line 114 rises to the power supply voltage Vcc. Because the gate input line 114 is not maintained at an intermediate voltage, both the P-channel MOSFET and the N-channel MOSFET of the inverter circuit 103 do not turn on at the same time, thereby preventing the possibility of a penetration current passing therethrough. With the similar reasoning, the output line 115 is not maintained at an intermediate voltage and a signal running therein operates stably. Because the switching is principally achieved by the pull-up or pull-down via the N-channel MOSFET 102, the size of the P-channel MOSFET 201 can be reduced.

It is likely that further miniaturization of a drive circuit element would be achieved with the reduction in power supply voltage. In this case, the addition of the P-channel MOSFET 201 ensures the high speed switching. The increase in threshold voltage caused by the back-bias effect is inherent in a MOSFET. When the power supply voltage Vcc is reduced, the pull-up voltage (Vcc-Vt) of the input line 114 obtained only by the N-channel MOSFET 102 can rise to only about a half of Vcc at most. As a result, the switching speed of the output inverter 103 is reduced. On the other hand, when the pull-up of the input line 114 is achieved by a P-channel MOSFET in addition to a N-channel MOSFET, the voltage increases to Vcc, and therefore, the switching speed of the output inverter 103 is increased.

Figure 5B:
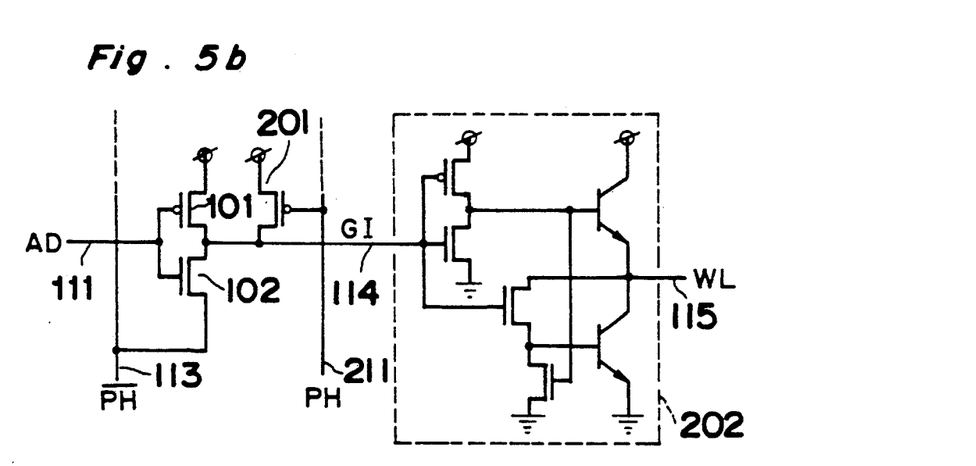
Figure 5C:
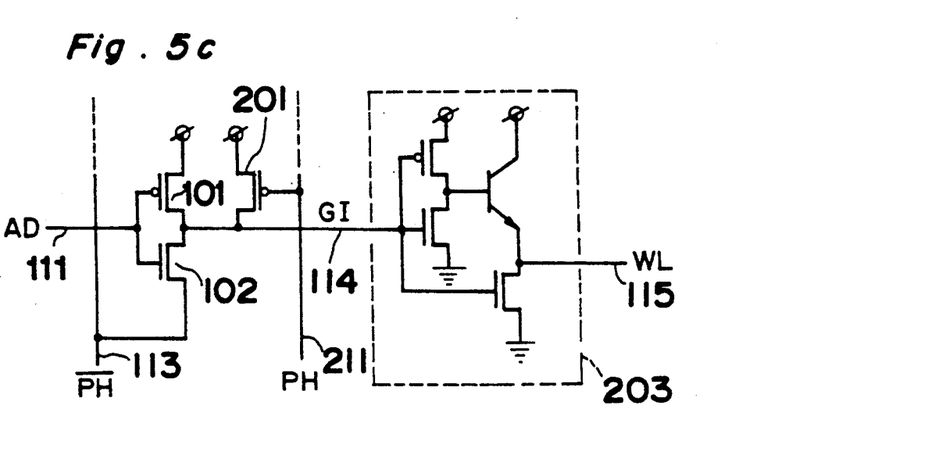

FIGS. 5b and 5c depicts modifications of the drive circuit element shown in FIG. 5a. The circuit elements shown in FIGS. 5b and 5c comprise a BiCMOS inverter circuit 202 and a BiNMOS inverter circuit 203, respectively.

The BiCMOS or BiNMOS circuit can drive a large-capacitance load at a higher speed than a CMOS circuit. In particular, the BiNMOS circuit enables a high speed switching operation even when the power supply voltage is low, for example 3 V to 3.3 V. Because a bi-polar transistor is used at the output stage, the output amplitude does not swing throughout the range from the power supply voltage Vcc to the ground voltage GND. The voltage at the state of "H" becomes (Vcc-Vbe) (BiCMOS circuit, BiNMOS circuit), which is less than the source voltage Vcc by a voltage Vbe between the base and the emitter whereas the voltage at the state of "L" becomes Vbe (BiCMOS circuit). In order to make the output amplitude swing throughout the full range, it is necessary to add a CMOS inverter circuit between an input and an output of the inverter circuit in parallel therewith or to incorporate a resistor between an output line and the base of an NPN transistor located on the pull-up side or between a ground line and the base of an NPN transistor located on the pull-down side. Any other conventionally known techniques are also available for this purpose.

Figure 6A:
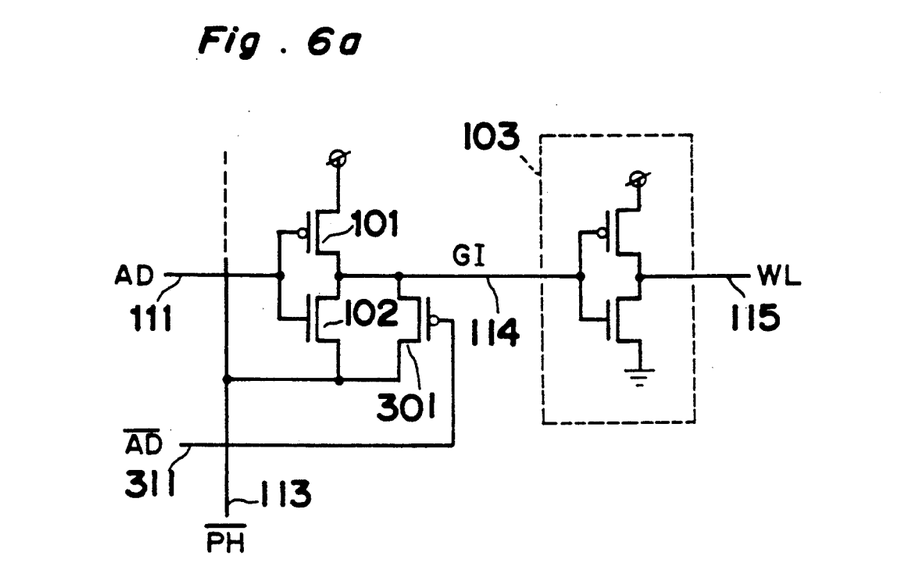
FIG. 6a is a diagram similar to FIG. 3, according to a third embodiment of the present invention.

FIG. 6a depicts a drive circuit element according to a third embodiment of the present invention, in which are provided an N-channel MOSFET 102 having a gate connected to an output line 111 of a decoded signal AD and a P-channel MOSFET 301 having a gate connected to an output line 311 of an inverted decoded signal $\overline{AD}$ so as to pull-up an inverter input line 114 during the OFF-state of the circuit element.

In this embodiment, a circuit required to pull-up a gate input line 114 comprises a CMOS-type transfer gate. Accordingly, the inverter input line 114 is raised to the power supply voltage Vcc during the OFF-state of the circuit element, thereby preventing a threshold voltage of a MOSFET from reducing the pull-up voltage.

Figure 6B:
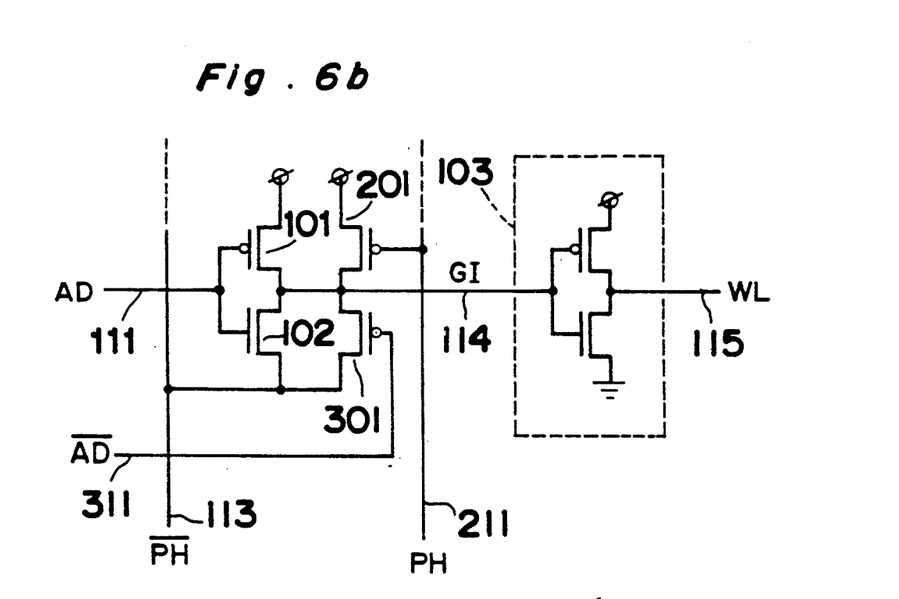
Figure 7:
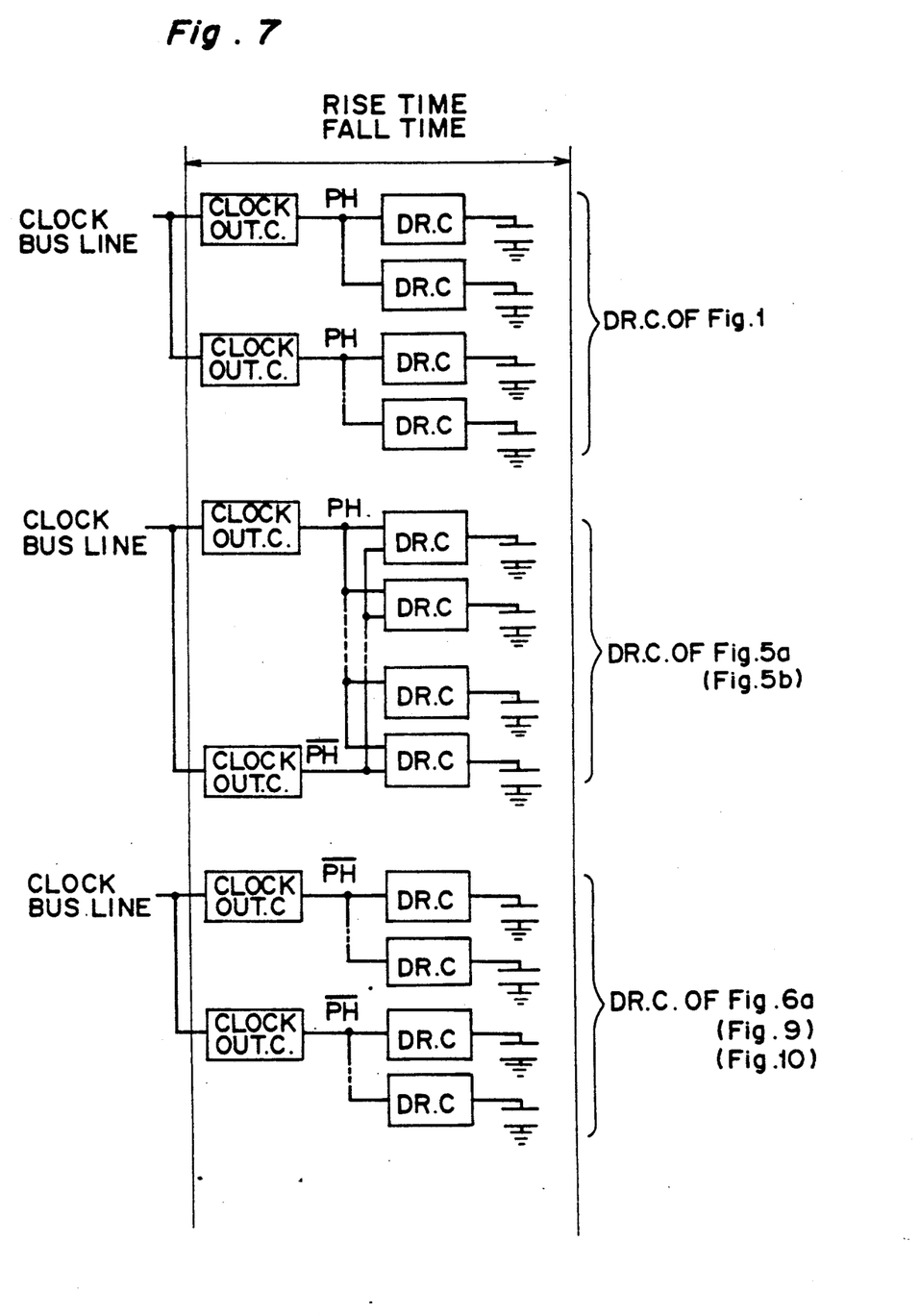
FIG. 7 is a schematic block diagram of a plurality of drive circuits made for comparison between the conventional circuit elements and the circuit elements according to the present invention.

FIG. 6b depicts a modification of the drive circuit element of FIG. 6a, in which are provided both the P-channel MOSFET 201 shown in FIG. 5a and the P-channel MOSFET 301 shown in FIG. 6a to pull-up the inverter input line 114.

In this case also, when further miniaturization of a drive circuit element is achieved with the reduction in power supply voltage, the addition of the P-channel MOSFET 301 ensures the high speed switching. The increase in threshold voltage caused by the back-bias effect is inherent in a MOSFET, as mentioned previously. When the power supply voltage Vcc is reduced, the pull-up voltage (Vcc-Vt) of the input line 114 obtained only by the N-channel MOSFET 102 can rise to only about a half of Vcc at most. As a result, the switching speed of the output inverter 103 is reduced. On the other hand, when the pull-up of the input line 114 is achieved by a P-channel MOSFET in addition to a N-channel MOSFET, the voltage increases to Vcc, and therefore, the switching speed of the output inverter 103 is increased.

The fact that the drive circuit element according to the present invention can perform a high-speed switching operation is discussed hereinafter with reference to the result of a SPICE simulation. Six kinds of drive circuit elements were used for comparison: the circuit element of FIG. 5a employing a CMOS output inverter circuit; that of FIG. 5b employing a BiCMOS output inverter circuit; that of FIG. 6a employing a CMOS output inverter circuit; that of FIG. 6a employing a BiCMOS output inverter circuit; the conventional circuit element of FIG. 1 employing a CMOS output inverter circuit; and the conventional circuit element of FIG. 1 employing a BiCMOS output inverter circuit.

It is to be noted here that the sum in the gate size of a clock output circuit was set so as to be the same in the six kinds of circuit elements for unification of the conditions for comparison. The number of circuit elements connected to the clock output circuit was also set so as to be the same. Furthermore, each circuit element had an output inverter with the same gate size and drove the same load.

Figure 8A:
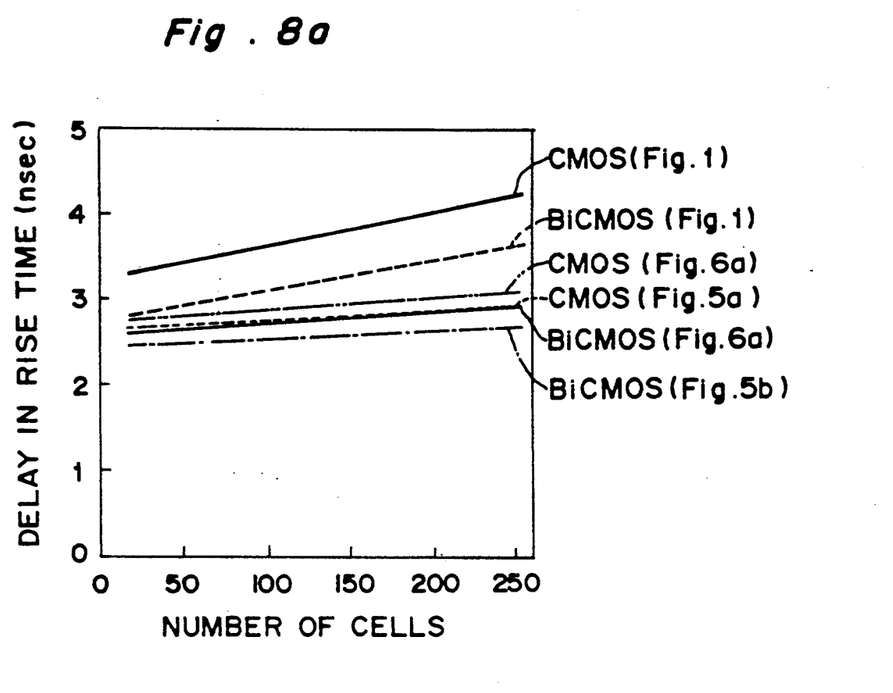
FIGS. 8a and 8b are graphs indicative of delay times in the circuit elements shown in FIG. 7.

A graph of FIG. 8a indicates the time from a rising edge of a clock signal generated on a clock bus line to a corresponding rising edge of an output signal generated on an output line. A graph of FIG. 8b indicates the time from a falling edge of the clock signal to a corresponding falling edge of the output signal.

When a CMOS output inverter circuit is employed, the delay time in the rise time can be reduced to about 69-80% in the circuit element of FIG. 5a and to about 72-83% in the circuit element of FIG. 6a, as compared with the conventional circuit element of FIG. 1. When a BiCMOS output inverter circuit is employed, the delay time in the rise time can be reduced to about 73-87% in the circuit element of FIG. 5b and to about 80-93% in the circuit element of FIG. 6a, as compared with the conventional circuit element.

The same tendency is shown in the fall time. In the case of the CMOS output inverter circuit, the delay time can be reduced to about 59-70% in the circuit element of FIG. 5a and to about 65-75% in the circuit element of FIG. 6a. In the case of the BiCMOS output inverter circuit, the delay time can be reduced to about 63-80% in the circuit element of FIG. 5b and to about 72-87% in the circuit element of FIG. 6a.

As shown in the result of the simulation, the more the number of drive circuit elements connected to a single signal line is, the more the delay time can be reduced. Furthermore, the circuit element of the present invention employing the CMOS inverter circuit can perform a switching operation at a higher speed than the conventional circuit element employing the BiCMOS inverter circuit. Even when the CMOS process technique is used which is available at a low cost, the circuit element according to the present invention can achieve a higher switching than the conventional one employing the BiCMOS circuit.

Figure 9:
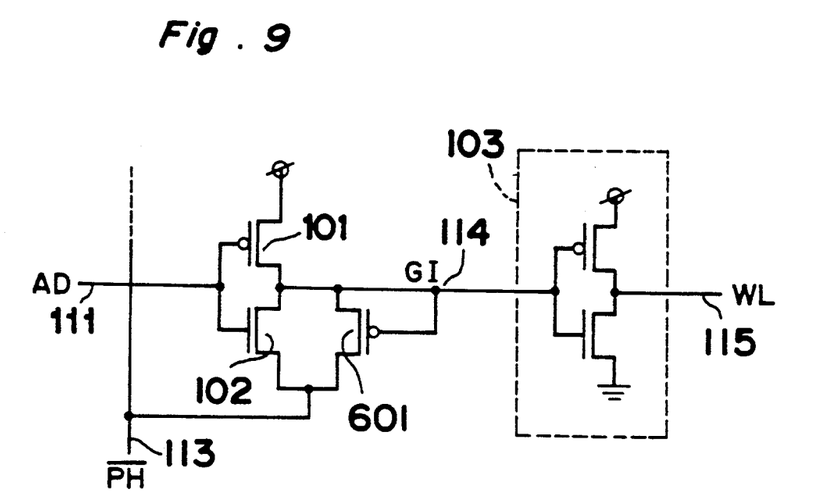
FIG. 9 is a diagram similar to FIG. 3, according to a fourth embodiment of the present invention.

FIG. 9 depicts a drive circuit element according to a fourth embodiment of the present invention, in which are employed an N-channel MOSFET 102 having a gate connected to an output line 111 of a decoded signal AD and a P-channel MOSFET 601 having a gate connected to an inverter input line 114 and a source connected to an input line 113 of an inverted clock signal $\overline{PH}$ in order to control the voltage of the inverter input line 114. In this embodiment, although the back-bias effect of the N-channel MOSFET 102 reduces the voltage of the gate input line, a high-speed switching operation can be achieved because the pull-up or pull-down of the inverter input line 114 is performed by both the N-channel MOSFET 102 and the P-channel MOSFET 601. Furthermore, because neither the inverted ADDRESS signal $\overline{AD}$ nor the clock signal PH is required for the input line, the area for layout thereof can be reduced and the load imposed on the clock signal can be lightened.

Figure 10:
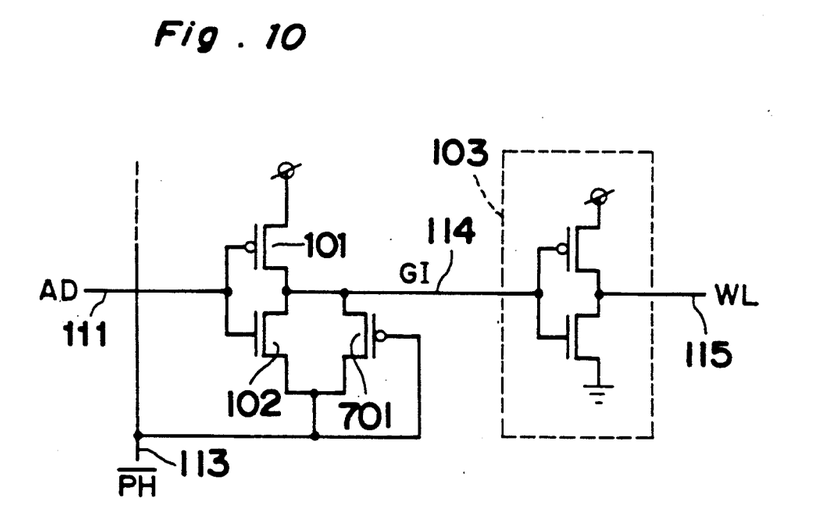
FIG. 10 is a diagram similar to FIG. 3, according to a fifth embodiment of the present invention.

FIG. 10 depicts a drive circuit element according to a fifth embodiment of the present invention. In this embodiment, an N-channel MOSFET 102 having a gate connected to an output line 111 of a decoded signal AD and a P-channel MOSFET 701 having a source and a gate both connected to an input line 113 of an inverted clock signal $\overline{PH}$ are provided to control the voltage of an inverter input line 114. In this embodiment also, although the back-bias effect of the N-channel MOSFET 102 causes a reduction in voltage of the gate input line 114, a high-speed switching operation can be achieved because the pull-up or pull-down of the inverter input line 114 is performed by both the N-channel MOSFET 102 and the P-channel MOSFET 701. Furthermore, because neither the inverted ADDRESS signal $\overline{AD}$ nor the clock signal PH is required for the input line, the area for layout thereof can be reduced.

Figure 11A:
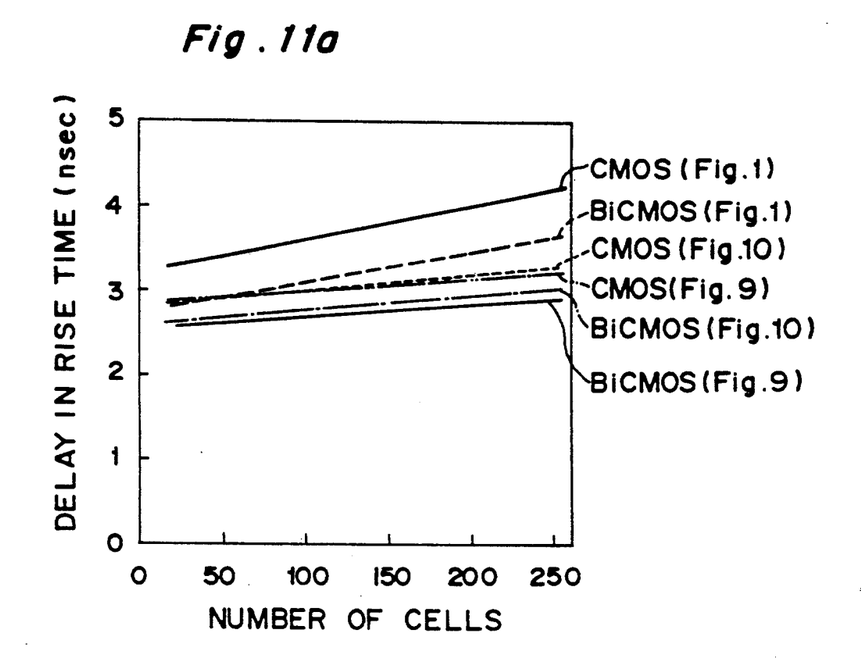
FIGS. 11a and 11b are graphs similar to FIGS. 8a and 8b, showing delay times in the conventional circuit elements and the circuit elements of FIGS. 9 and 10.
Figure 11B:
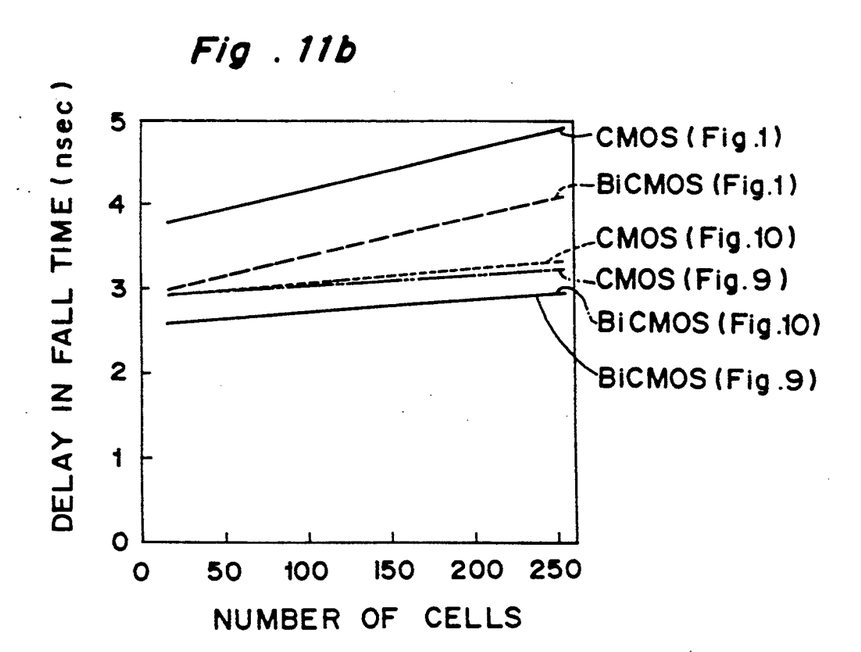

FIGS. 11a and 11b indicate the results of comparisons in delay time obtained through a SPICE simulation of the circuit elements shown in FIGS. 9 and 10. A CMOS inverter circuit or a BiCMOS inverter circuit is used as an output inverter circuit, and the gate size and the load of a clock output circuit were set in a manner similar to the analysis made to obtain the results of FIGS. 8a and 8b. FIGS. 11a and 11b correspond to FIGS. 8a and 8b, respectively.

When a CMOS output inverter circuit is employed, the delay time in the rise time can be reduced to about 77-86% in the circuit element of FIG. 9 or 10, as compared with the conventional circuit element of FIG. 1. On the other hand, when a BiCMOS output inverter circuit is employed, the delay time in the rise time can be reduced to about 78-93% in the circuit element of FIG. 9 and to about 82-93% in the circuit element of FIG. 10, as compared with the conventional circuit element.

The same tendency is shown in the fall time. In the case of the CMOS output inverter circuit, the delay time can be reduced to about 66-76% in the circuit element of FIG. 9 and to about 67-78% in the circuit element of FIG. 10. In the case of the BiCMOS output inverter circuit, the delay time can be reduced to about 72-85% in both the circuit elements of FIGS. 9 and 10.

Figure 8B:
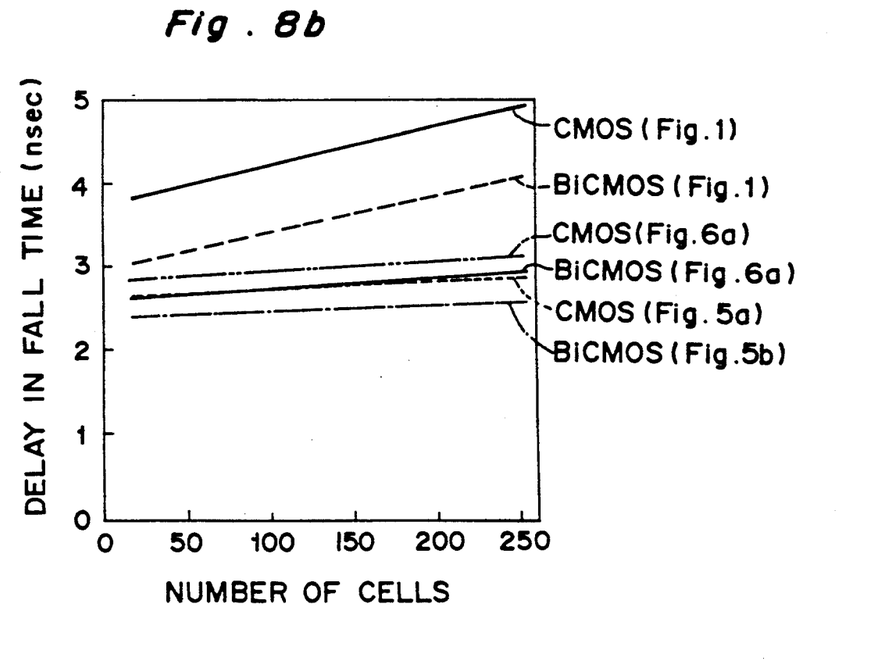

These results of the simulation show the same tendency as those shown in FIGS. 8a and 8b. The more the number of drive circuit elements connected to a single signal line is, the more the delay time can be reduced. Furthermore, the circuit element of the present invention employing the CMOS inverter circuit can perform a switching operation at the same or a higher speed than the conventional circuit element employing the BiCMOS inverter circuit. Even when the CMOS process technique is used, the circuit element according to the present invention can achieve a higher switching than the conventional one employing the BiCMOS circuit.

As is clear from the above, according to the present invention, an input signal line is connected to a source of a transfer gate for the control of the input voltage of an output inverter circuit, thereby reducing an input load capacitance and enabling a high-speed switching operation. Accordingly, the drive circuit element of the present invention is particularly suited for use in a semiconductor integrated circuit. Furthermore, because an output inverter circuit may comprise any one of a CMOS circuit, a BiCMOS circuit, a BiNMOS circuit, and a complementary BiCMOS circuit, a high-speed drive circuit element can be realized without depending on the process technique.

Although the present invention has been fully described by way of examples with reference to the accompanying drawings, it is to be noted here that various changes and modifications will be apparent to those skilled in the art. Therefore, unless such changes and modifications otherwise depart from the spirit and scope of the present invention, they should be construed as being included therein.

What is claimed is:

1. In a drive circuit suited for use in a semiconductor integrated circuit, said drive circuit capable of performing a high-speed switching in compliance with a synchronizing signal and comprising a number of drive circuit elements, each of said drive circuit elements comprising:
   a first P-channel MOSFET having a gate connected to an input line of a first input signal and a source connected to a power supply line;
   an N-channel MOSFET having a gate connected to the input line of said first input signal, a source connected to an input line of an inverted logic signal of a second input signal, and a drain connected to a drain of said first P-channel MOSFET;
   a second P-channel MOSFET having a gate connected to an input line of said second input signal, a source connected to the power supply line, and a drain connected to the drain of said first P-channel MOSFET; and
   an inverter circuit having an input connected to the drain of said first P-channel MOSFET,
   whereby an output signal is generated in synchronization with said second input signal.

2. In a drive circuit suited for use in a semiconductor integrated circuit, said drive circuit capable of performing a high-speed switching in compliance with a synchronizing signal and comprising a number of drive circuit elements, each of said drive circuit elements comprising:
   a first P-channel MOSFET having a gate connected to an input line of a first input signal and a source connected to a power supply line;
   an N-channel MOSFET having a gate connected to the input line of said first input signal, a source connected to an input line of an inverted logic signal of a second input signal, and a drain connected to a drain of said first P-channel MOSFET;
   a second P-channel MOSFET having a gate connected to an input line of an inverted logic signal of said first input signal, a source connected to the input line of the inverted logic signal of said second input signal, and a drain connected to the drain of said first P-channel MOSFET; and
   an inverter circuit having an input connected to the drain of said first P-channel MOSFET,
   whereby an output signal is generated in synchronization with said second input signal.

3. In a drive circuit suited for use in a semiconductor integrated circuit, said drive circuit capable of performing a high-speed switching in compliance with a synchronizing signal and comprising a number of drive circuit elements, each of said drive circuit elements comprising:
   a first P-channel MOSFET having a gate connected to an input line of a first input signal and a source connected to a power supply line;
   an N-channel MOSFET having a gate connected to the input line of said first input signal, a source connected to an input line of an inverted logic signal of a second input signal, and a drain connected to a drain of said first P-channel MOSFET;
   a second P-channel MOSFET having a gate connected to the drain of said first P-channel MOSFET, a source connected to the input line of the inverted logic signal of said second input signal and a drain connected to the drain of said first P-channel MOSFET; and
   an inverter circuit having an input connected to the drain of said first P-channel MOSFET,
   whereby an output signal is generated in synchronization with said second input signal.

4. In a drive circuit suited for use in a semiconductor integrated circuit, said drive circuit capable of performing a high-speed switching in compliance with a synchronizing signal and comprising a number of drive circuit elements, each of said drive circuit elements comprising:
   a first P-channel MOSFET having a gate connected to an input line of a first input signal and a source connected to a power supply line;
   an N-channel MOSFET having a gate connected to the input line of said first input signal, a source connected to an input line of an inverted logic signal of a second input signal, and a drain connected to a drain of said first P-channel MOSFET;
   a second P-channel MOSFET having a gate and a source both connected to the input line of the inverted logic signal of said second input signal and a drain connected to the drain of said first P-channel MOSFET; and
   an inverter circuit having an input connected to the drain of said first P-channel MOSFET,
   whereby an output signal is generated in synchronization with said second input signal.

* * * * *